(12) United States Patent
Carlough et al.

(10) Patent No.: US 8,364,734 B2
(45) Date of Patent: *Jan. 29, 2013

(54) CONVERTING FROM DECIMAL FLOATING POINT INTO SCALED BINARY CODED DECIMAL

(75) Inventors: Steven R. Carlough, Poughkeepsie, NY (US); Eric M. Schwarz, Gardiner, NY (US); Sheryll H. Veneracion, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 1652 days.

This patent is subject to a terminal disclaimer.

(21) Appl. No.: 11/227,481

(22) Filed: Sep. 15, 2005

(65) Prior Publication Data

US 2007/0061387 A1    Mar. 15, 2007

(51) Int. Cl.
    *G06F 7/00*    (2006.01)
(52) U.S. Cl. ...................................... 708/204
(58) Field of Classification Search .................. None
    See application file for complete search history.

(56) References Cited

U.S. PATENT DOCUMENTS

| | | | | |
|---|---|---|---|---|
| 3,934,462 A | | 1/1976 | Rende | 73/80 |
| 4,075,679 A | * | 2/1978 | Christopher et al. | 708/130 |
| 4,429,370 A | | 1/1984 | Blau et al. | 364/748 |
| 4,442,498 A | | 4/1984 | Rosen | 364/745 |
| 4,589,087 A | * | 5/1986 | Auslander et al. | 708/670 |
| 4,799,181 A | | 1/1989 | Tague et al. | 364/736 |
| 4,975,868 A | | 12/1990 | Freerksen | 364/748 |
| 5,220,523 A | | 6/1993 | Yoshida et al. | 364/718 |
| 5,268,855 A | | 12/1993 | Mason et al. | 364/748 |
| 5,384,723 A | | 1/1995 | Karim et al. | 364/748 |
| 5,481,489 A | * | 1/1996 | Yanagida et al. | 708/525 |
| 5,696,711 A | | 12/1997 | Makineni | 364/748.03 |
| 5,729,228 A | * | 3/1998 | Franaszek et al. | 341/106 |
| 5,982,307 A | * | 11/1999 | Adachi | 341/84 |
| 6,098,192 A | | 8/2000 | Glover | 714/770 |
| 6,369,725 B1 | | 4/2002 | Busaba | 341/84 |
| 6,437,715 B1 | | 8/2002 | Cowlishaw | 341/105 |

(Continued)

FOREIGN PATENT DOCUMENTS

| | | |
|---|---|---|
| JP | 9062863 A | 3/1997 |
| JP | 9069781 A | 9/1998 |

(Continued)

OTHER PUBLICATIONS

Title: "Lecutre Notes on the Status of IEEE 754" Author: "Kahan, Prof. W." Date: "May 31, 1996" Pertinent pp. 2,4 URL: http://www.cs.berkeley.edu/~wkahan/ieee754status/ieee754.ps.*

(Continued)

*Primary Examiner* — Chuong D Ngo
(74) *Attorney, Agent, or Firm* — Cantor Colburn LLP; Dennis Jung

(57) ABSTRACT

A system and method for converting from decimal floating point (DFP) into scaled binary coded decimal (SBCD). The system includes a mechanism for receiving a DFP number. The system also includes at least one of a mechanism for performing coefficient expansion on the DFP number to create a binary coded decimal (BCD) coefficient part of a SBCD number and a mechanism for performing exponent extraction on the DFP number to create an exponent part of the SBCD number.

14 Claims, 6 Drawing Sheets

U.S. PATENT DOCUMENTS

| | | | |
|---|---|---|---|
| 6,525,679 B1 * | 2/2003 | Cowlishaw | 341/104 |
| 6,681,237 B1 | 1/2004 | Fossum et al. | 708/606 |
| 6,745,220 B1 | 6/2004 | Hars | 708/606 |
| 6,842,124 B2 | 1/2005 | Penna | 341/67 |
| 6,898,615 B2 | 5/2005 | Miyasaka et al. | 708/606 |
| 7,467,174 B2 * | 12/2008 | Wang et al. | 708/504 |
| 2002/0184282 A1 * | 12/2002 | Yuval et al. | 708/495 |
| 2003/0005189 A1 * | 1/2003 | Wilson et al. | 710/33 |
| 2006/0047739 A1 * | 3/2006 | Schulte et al. | 708/495 |
| 2006/0265443 A1 * | 11/2006 | Cornea-Hasegan | 708/204 |

FOREIGN PATENT DOCUMENTS

WO  WO0108001 A1  2/2001

OTHER PUBLICATIONS

Carter et al.; "Efficient Floating Point to Clipped Integer Conversion;" IBM Technical Disclosure; May 1992; pp. 364-365.

* cited by examiner

CONVERTING FROM DECIMAL FLOATING POINT INTO SCALED BINARY CODED DECIMAL

TRADEMARKS

IBM® is a registered trademark of International Business Machines Corporation, Armonk, N.Y., U.S.A. S390, Z900 and z990 and other names used herein may be registered trademarks, trademarks or product names of International Business Machines Corporation or other companies.

BACKGROUND OF THE INVENTION

This invention relates to decimal floating point (DFP) numbers, and more particularly to converting from DFP numbers into scaled binary coded decimal (SBCD) floating point numbers.

DFP has been used in calculators for many years but for the first time it is becoming part of an IEEE standard (754R Floating Point Standard). The DFP formats, as defined by the IEEE 754R standard, include: a thirty-two bit single precision format, a sixty-four bit double precision format, and a one hundred and twenty eight bit extend precision format. This new standard provides the means for computer designers to develop specific operations that are optimized to this new standard. Prior to the standardization of the operands it was not possible to develop specific operations to accelerate these types of computations. For some commercial workloads, emulation of DFP operations in software can dominate the processing timing.

With the advent of the new standard and the increase in the use of decimal arithmetic operations for financial calculations, it becomes desirable to implement these operations at a high performance.

BRIEF SUMMARY OF THE INVENTION

Exemplary embodiments of the present invention include a system for converting from decimal floating point (DFP) into scaled binary coded decimal (SBCD). The system includes a mechanism for receiving a DFP number. The system also includes at least one of a mechanism for performing coefficient expansion on the DFP number to create a binary coded decimal (BCD) coefficient part of a SBCD number and a mechanism for performing exponent extraction on the DFP number to create an exponent part of the SBCD number.

Additional exemplary embodiments include a method for converting from DFP into SBCD. The method includes receiving a DFP number. The method also includes performing at least one of a coefficient expansion on the DFP number to create a coefficient part of a SBCD number and exponent extraction on the DFP number to create an exponent part of the SBCD number.

Further exemplary embodiments include a system for converting from DFP into SBCD. The system includes a mechanism for receiving a DFP number. The system also includes either a mechanism for performing coefficient expansion or a mechanism for performing exponent extraction. The mechanism for performing coefficient expansion creates a BCD coefficient part of the SBCD number from the DFP number. The mechanism for performing exponent extraction creates an exponent part of the SBCD number from the DFP number. The mechanism for performing coefficient expansion is implemented by double precision hardware. The DFP number is single precision, double precision or extended precision. The performing coefficient expansion includes determining if the DFP number is a special number, and setting a condition code if the DFP number is a special number. The performing exponent extraction includes determining if the DFP number is a special number and setting the exponent part of the SBCD to indicate that the SBCD number is a special number.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
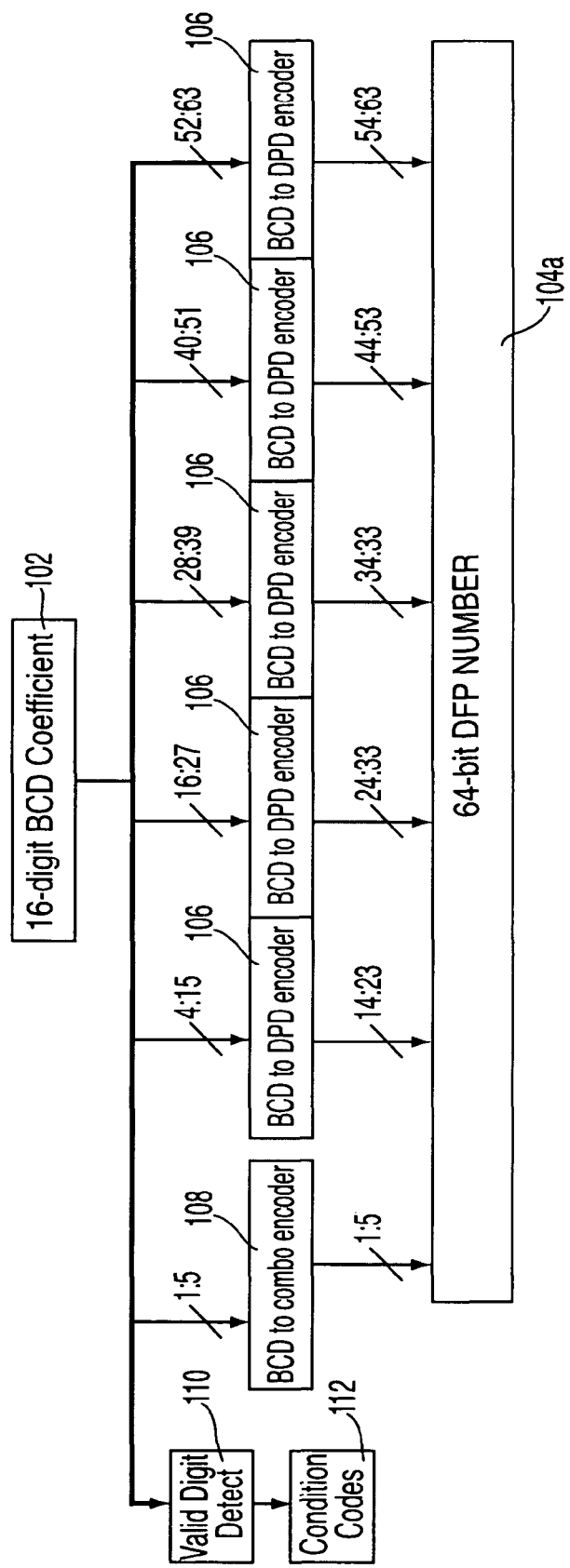
FIG. 1 is an exemplary hardware diagram for implementing the compression of a coefficient from BCD to DPD according to exemplary embodiments of the present invention.

The detailed description explains the exemplary embodiments of the invention, together with advantages and features, by way of example with reference to the drawings.

DETAILED DESCRIPTION OF THE INVENTION

Exemplary embodiments of the present invention include operations for converting a coefficient of a DFP number to and from SBCD. Embodiments support the three different DFP formats (single precision—32 bit, double precision—64 bit, and extended precision 128 bit). In addition, exemplary embodiments set condition codes that allow the processor to rapidly detect when the source operand contains invalid data or special numbers, such as: infinity, quiet Not-A-Number (qNaN) and signaling Not-A-Number (sNaN). Exemplary embodiments of the present invention also describe operations for extracting and setting the exponent field of the DFP numbers for the three different DFP formats. Special numbers are handled by these operations using a number format that is compatible between the insert and extract instructions. Conditions codes are set to allow the processor to rapidly detect when a special number has been processed.

Exemplary embodiments include both conversion from a SBCD number (includes both a BCD coefficient and a binary exponent) into a DFP number and conversion from a DFP number into a SBCD number. The conversion from a SBCD number into a DFP number includes a compression of the BCD coefficient and an insertion of the SBCD exponent into the DFP number. The conversion from a DFP number into a SBCD number includes both an expansion of the DFP coefficient into a BCD coefficient and an extraction of the DFP exponent into the SBCD binary exponent.

Three different formats for a SBCD number are shown below in Table 1. The term SBCD number as used herein refers to a number that includes both a coefficient represented in BCD and an exponent represented in binary as well as an optional one bit sign field.

TABLE 1

SBCD Number Formats

| FORMAT | NUMBER OF BITS IN EACH FIELD | | |
|---|---|---|---|
| | Sign | Exponent | Coefficient |
| Single Precision | 1 | 8 | 28 (7 digits) |
| Double Precision | 1 | 10 | 64 (16 digits) |
| Extended Precision | 1 | 14 | 136 (34 digits) |

The three different formats for a DFP number are shown in Table 2 below. The sign field (labeled "S" in Table 2) indicates the sign of the operand, the combination field (labeled "C" in Table 2) contains the upper most significant digit (MSD) of the coefficient and the two most significant exponent bits encoded into a five bit coded format, the biased exponent continuation field (labeled "BEC" in Table 2) contains all but the two most significant bits of the exponent, and the coefficient continuation field (labeled "CC" in Table 2) contains all but the MSD of the coefficient in densely packed decimal (DPD) format.

TABLE 2

DFP Number Formats

| FORMAT | NUMBER OF BITS IN EACH FIELD | | | |
|---|---|---|---|---|
| | S | C | BEC | CC |
| Single Precision | 1 | 5 | 6 | 20 |
| Double Precision | 1 | 5 | 8 | 50 |
| Extended Precision | 1 | 5 | 12 | 110 |

As described previously, the combination field contains the upper MSD of the coefficient and the two most significant exponent bits encoded in a five bit coded format. Table 3, below, shows this five bit coding as described in the IEEE 754R standard where $d_0, d_1, d_2, d_3$ are from the BCD coding for the MSD of the coefficient and $b_0, b_1$ are the two most significant bits of the exponent.

TABLE 3

Coding of the Combination Field

| Condition | Combination Field Coding |
|---|---|
| MSD = 0 to 7 | $b_0, b_1, d_1, d_2, d_3$ |
| MSD = 8 or 9 | $1, 1, b_0, b_1, d_3$ |
| Infinity | 1, 1, 1, 1, 0 |
| NaN | 1, 1, 1, 1, 1 |

The combination field is utilized by exemplary embodiments to quickly recognize special numbers such as, but not limited to: qNaN, sNaN and infinity values. Special numbers can be detected by examining the digits in the combination field.

Compression of the Coefficient (BCD to DFP)

The compression operation primarily deals with the combination field which contains the most significant digit of the coefficient data (along with the most significant two bits of the exponent data) and the coefficient continuation field which contains the remaining 7, 15 or 33 BCD digits of the coefficient compressed into 20, 50 or 110 DPD bits depending on the target DFP format. The compression operation takes the BCD coefficient and creates a DPD coefficient for storage in the DFP number and generates a 5-bit combination field from the value based on the most significant BCD digit of the coefficient. This is also referred to herein as a compress from BCD (CBCDR).

The CBCDR operation may be implemented as a computer instruction that takes 16 BCD coefficient digits from the source operand and compresses the right most 15 digits into DPD bits and writes them to the right most 50 bits of the target register. The upper most digit is encoded into the combination field assuming an exponent value of zero and is written to the target register. The sign field and bits 6 to 13 of the target register (BEC for double precision operands) are positive and zero respectively. If the source register contains invalid BCD numerical codes then condition code one is set, otherwise condition code zero is set. Setting the condition code based on valid decimal data prevents the need for extra instructions specifically to verify the source data and saves a significant number of cycles and instructions for a typical processor.

FIG. 1 depicts an exemplary hardware diagram for implementing the compression of a coefficient from BCD into DFP (i.e., a CBCDR instruction) according to exemplary embodiments of the present invention. FIG. 1 includes a 16 digit BCD coefficient 102 as input to a valid digit detect block 110, a BCD to combination field encoder 108 and a plurality of BCD to DPD encoders 106. The plurality of BCD to DPD encoders 106 is also referred to herein as one bank of DPD to BCD encoders. Condition codes 112 are set in response to determining if the BCD coefficient operand 102 is a valid BCD number. In exemplary embodiments, the condition code is set to zero if the SBCD coefficient 102 is a valid BCD number, and is set to one if the BCD coefficient 102 contains an invalid BCD number.

The BCD to DPD encoders 106 each compress three BCD digits (12 bits) of the BCD coefficient 102 into 10 bits of DPD. The compression is applied to all but the MSD of the SBCD coefficient 102. For double precision numbers, the compressed coefficient is stored in the fifty least significant bits of the DFP number 104a. The BCD to combination field encoder 108 creates the 5 digit combination field described previously based on the MSD of the coefficient of the SBCD number. The combination field is stored in the second through sixth bits of the DFP number 104a.

For a double precision formatted operand, the 64-bit DFP number 104a that is output from the processing depicted in FIG. 1 includes 64 bits with a sign bit in the most significant bit (bit 0), the combination field in the next five most significant bits (bits 1-5), a zero in the biased exponent continuation field (bits 6-13), and the compressed coefficient in the coefficient continuation field (bits 14-63).

Figure 2:
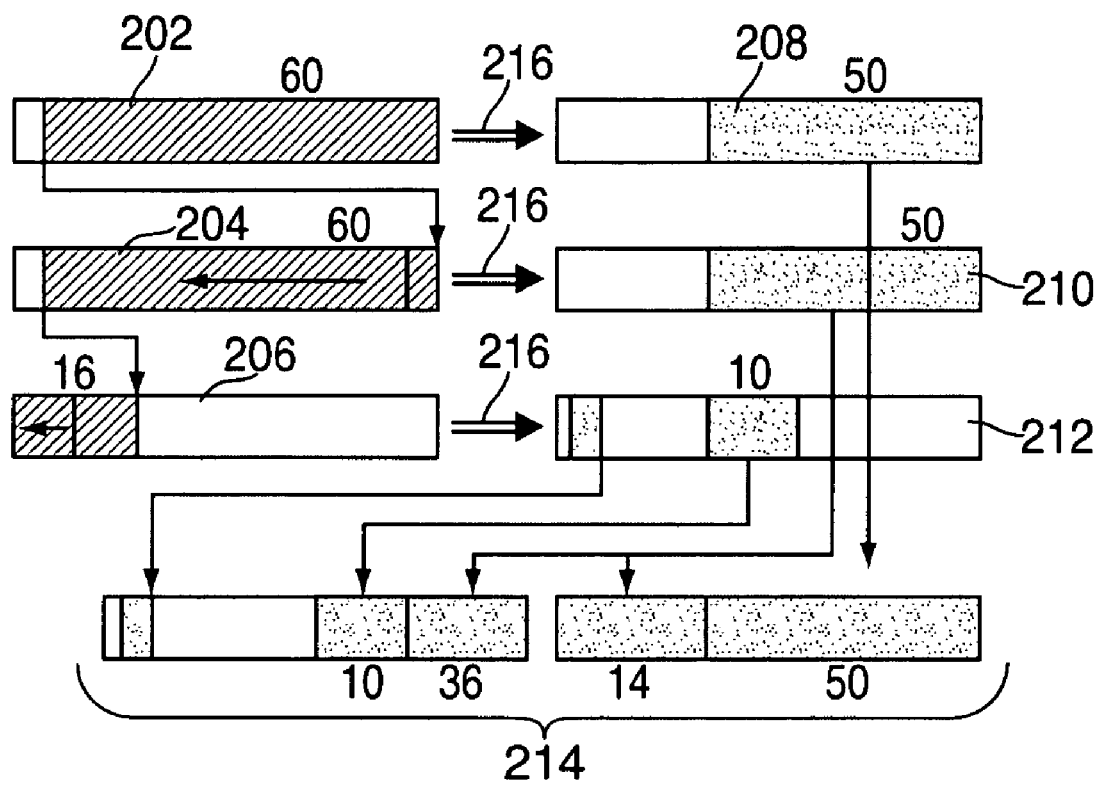
FIG. 2 is a block diagram of a process for converting a 34 BCD digit coefficient into a quad precision DFP operand according to exemplary embodiments of the present invention.

As mentioned above, the CBCDR operation is designed for double precision DFP operands which are expected to be the most common operand used in workloads. However, these instructions may be utilized to process extended precision operands as well. The process for compressing a 34 digit BCD coefficient to an extended format DFP number is depicted in FIG. 2.

The process for converting 34 digit BCD coefficient into a quad precision DFP operand includes a series of shift, merge, and CBCDR operations. The first source register 202 (the low order bits of the 34-digit BCD coefficient) on the left is compressed to 50 bits of DPD format and is written to a first intermediate register 208 on the right. The second source register 204 (digits 2 through 18 of the 34 digit BCD coefficient) is shifted one digit to the left and the MSD from the first source register 202 is merged into the vacated right most digit. This data is then compressed to 50 bits of DPD data and is written to a second intermediate register 210.

Next, the third source register 206 is shifted until it is left aligned and two digits (digits 0 to 1) that were unprocessed in the second source register 204 are merged to the right of the shifted third source operand data. A final compression is done as described in reference to the CBCDR instruction such that the MSD is processed such that it is aligned with the combination field of the target register. The results are written to a third intermediate register 212. The final step is to align the data in the intermediate registers 208, 210, 212 and merge it into a target register pair 214 with the sign bits and biased exponent continuation field set to positive and zero respectively.

The processing depicted by the arrows labeled 216 is the CBCDR operation described previously with respect to FIG. 1. This processing may be performed by the same hardware/software instructions executing sequentially and/or by having three sets of the same hardware/software instructions executing in parallel to produce the results in the first intermediate register 208, the second intermediate register 210 and the third intermediate register 212. In addition, the same CBCDR operation may be utilized to compress a single precision formatted number. The same hardware (e.g., 64 bit hardware) and/or software (e.g., millicode) may be utilized to perform the compression for any of the three precisions specified by the IEEE 754R standard for decimal floating point numbers.

Insertion of the Exponent (BCD number to DFP)

The instructions for inserting the binary exponent from the SBCD number into the DFP number primarily deal with the combination field and the biased exponent continuation field which contains the remaining 6, 8, or 12 bits of exponent data, depending on the format. The three insert exponent instructions include insert exponent single precision, insert exponent double precision, and insert exponent extended precision. Each of these instructions read a binary integer from a source register whose value is the biased exponent that is to be inserted into the DFP number in the target register. The MSD of the coefficient encoded in the target register is read to determine how the combination field should be encoded. The combination field and exponent continuation fields are then updated. The updating sets the exponent value of the target DFP number in the target register to the value contained in the source register.

If the source register is negative (bit 0=1) then the target register is to be updated with a special number. In exemplary embodiments, the least two significant bits are used to determine if the target register is updated with the value representing infinity (bits 62:63=11'b), qNaN (bits 62:63=10'b) or sNan (bit 62=0'b).

Figure 3:
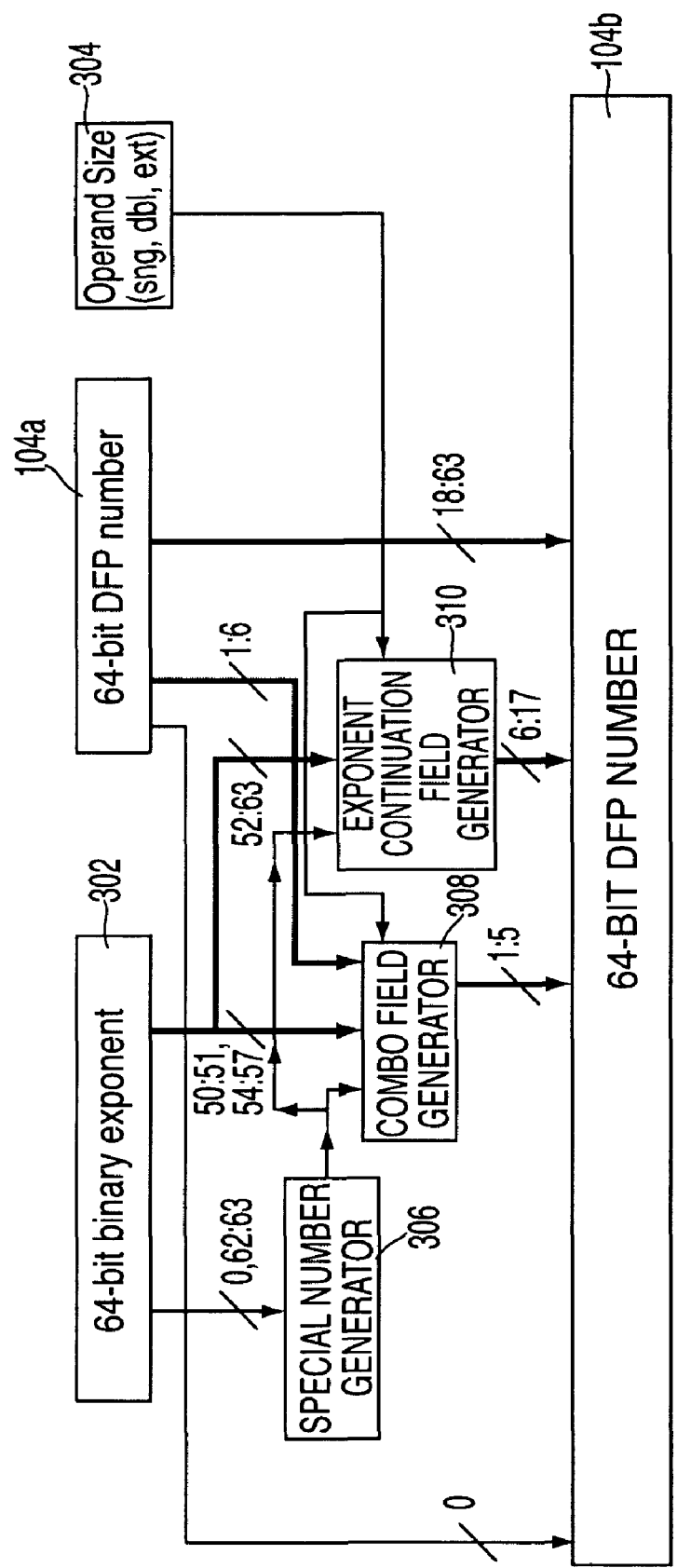
FIG. 3 is an exemplary hardware diagram for converting the exponent portion of a SBCD number to a DFP number according to exemplary embodiments of the present invention.

FIG. 3 depicts an exemplary hardware diagram for implementing the exponent insertion for a conversion from a binary exponent part of a SBCD number into an exponent part of a DFP number according to exemplary embodiments of the present invention. FIG. 3 depicts a 64 bit binary exponent 302, and the 64 bit DFP number 104*a* output from the processing described in reference to FIG. 1. The output from the processing depicted in FIG. 3 is an updated 64-bit DFP number 104*b* that includes updates to the combination and biased exponent continuation fields. Operand bits 0, 62, and 63 of the 64 bit binary exponent 302 are input to a special number generator 306 to generate the special values infinity, qNaN and sNaN as previously discussed if the binary exponent is negative (bit 0 is a value of '1'). The combination field generator 308 receives 6 bits (bits 50-51 and 54-57) of the binary exponent 302, the results from the special number generator 306, the operand size 304, and the DFP number 104*a*. The combination field generator 308 generates bits 1 to 5 of the result (the combination field) and first bit of the exponent continuation field) and writes the result to the 64-bit DFP number 104*b*. The processing in FIG. 3 also includes an exponent continuation field generator 310 for updating the biased exponent continuation field of the DFP number 104*b*. In an exemplary embodiment, the output from the special number generator 306 is input to the exponent continuation field generator 310. If the special number generator 306 indicates that the DFP number is a qNaN, then the exponent continuation field generator 310 overwrites the most significant bit of the exponent field (bit 6) with a "0". If the special number generator 306 indicates that the DFP number is a sNaN, then the exponent continuation field generator 310 overwrites the most significant bit of the exponent field (bit 6) with a "1".

Expansion of the Coefficient (DFP to BCD)

The expansion to BCD operation takes a double precision DFP number in a source register and converts the coefficient digits of the DFP number, stored as DPD and combination field, into a BCD coefficient which is written to a target register. If the source operand is a special number such as infinity, qNaN, or sNaN, a zero is written to the MSD of the target register and the condition codes may be set accordingly (infinity=1, qNaN=2, sNaN=3). This operation is also refereed to herein as an extract to BCD operation (EBCDR).

Figure 4:
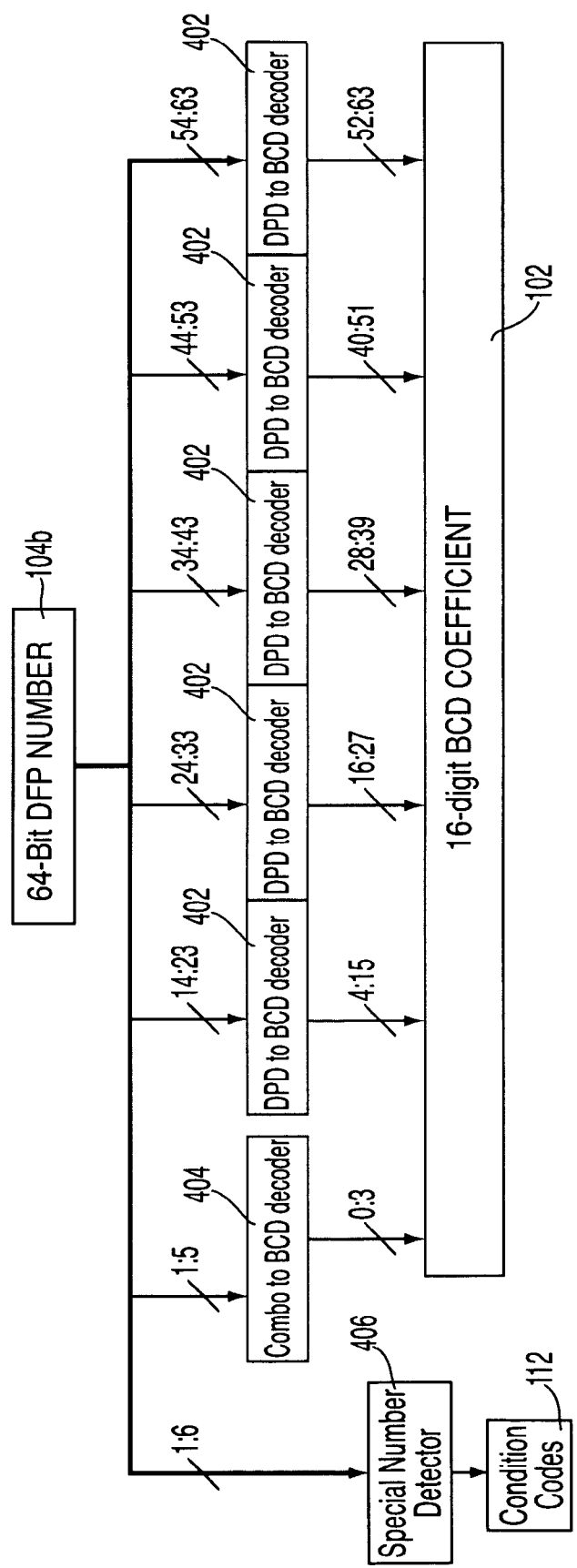
FIG. 4 is an exemplary hardware diagram for implementing the expansion of a coefficient from DPD to BCD according to exemplary embodiments of the present invention.

FIG. 4 depicts an exemplary hardware diagram for implementing the EBCDR process according to exemplary embodiments of the present invention. FIG. 4 includes the 64-bit DFP number 104*b* as input to optional special number detector 406, a combination field to BCD decoder 404 and to a plurality of DPD to BCD decoders 402. Condition codes 112 are set in response to determining if the coefficient portion of the DFP number 104*b* is a special number. In exemplary embodiments, the condition code is set to zero if the coefficient is normal, set to one if the coefficient is infinity, set to 2 if the coefficient is qNaN and set to 3 if the coefficient is sNaN.

The DPD to BCD decoders 402 each expand 10 bits of the DPD into three BCD digits (12 bits). The decoding is applied to all of the bits in the coefficient continuation field in the DFP number 104*b*. For double precision numbers, the expanded SBCD coefficient continuation field is stored as the 15 least significant digits of the 16-digit BCD coefficient 102. The combination field to BCD decoder 404 receives the 5 digit combination field 108 of the DFP number 104*b* and creates the MSD of the BCD coefficient.

Figure 5:
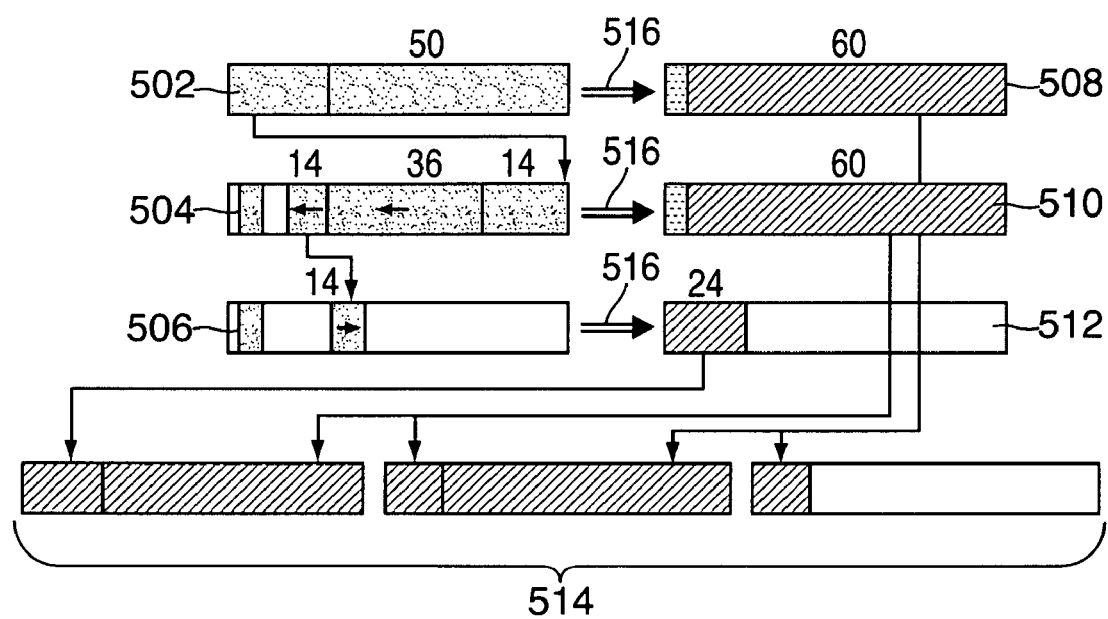
FIG. 5 is a block diagram of converting a quad precision DFP operand into a 34 BCD digit coefficient according to exemplary embodiments of the present invention.

As mentioned above, the EBCDR operation is designed for double precision DFP operands which are expected to be the most common operand used in workloads. However, as depicted in FIG. 5, these instructions may be utilized to process extended precision operands as well. The process depicted in FIG. 5 for converting a quad precision DFP number into a 34 digit BCD coefficient consists of a series of shift, merge, and EBCDR expansion steps.

The process depicted in FIG. 5 begins converting (e.g., using the EBCDR process depicted in FIG. 4) the low order 50 bits of the first source register 502 (low order 50-bits of a DFP extended precision operation) to 15 digits of BCD data in a first intermediate register 508. The coefficient continuation field of the second source register 504 (high order 64-bits of a DFP extended precision operand) is left shifted 14 bits and the unprocessed bits in the first source register 502 are merged to the right of them. A second expansion instruction (e.g., an EBCDR) writes 15 more BCD digits to a second intermediate register 510. The coefficient continuation field is then shifted 10 bits to the right and stored in the third source register 506. The final expansion instruction (e.g., an EBCDR) writes the remaining 4 BCD digits to a third intermediate register 512. Finally, the 34 BCD digits of data in the three intermediate registers 508 510 512 are aligned and merged into the three destination registers 514 allocated for this operation.

The processing depicted by the arrows labeled 516 is the EBCDR operation described previously with respect to FIG. 4. This processing may be performed by the same hardware/software instructions executing sequentially and/or by having three sets of the same hardware/software instructions executing in parallel to produce the results in the first intermediate register 508, the second intermediate register 510 and the third intermediate register 512. In addition, the same EBCDR operation may be utilized to compress a single precision formatted number. The same hardware (e.g., 64 bit hardware) and/or software (e.g., millicode) may be utilized to perform the compression for any of the three precisions specified by the IEEE 754R standard for decimal floating point numbers.

Extraction of the Exponent (DFP to SBCD)

The exponent extract instructions (one for each format) read the upper double word of the DFP number from the source register. For single precision and double precision this contains the whole DFP number. For normal numbers, the operation extracts the biased exponent from the encoded combination field and the biased exponent continuation field and sets the condition code to zero. If the source DFP number is infinity, then the SBCD exponent is set to a minus one and condition code one is set. If the source DFP number is a qNaN, then the SBCD exponent is set to a minus two and condition code two is set. If the source DFP number is a sNaN, then the SBCD exponent is set to a minus three and condition code three is set. Using condition codes in this manner allows the processor to rapidly detect when a special number is processed and eliminates the need for special instructions to detect these special cases.

Figure 6:
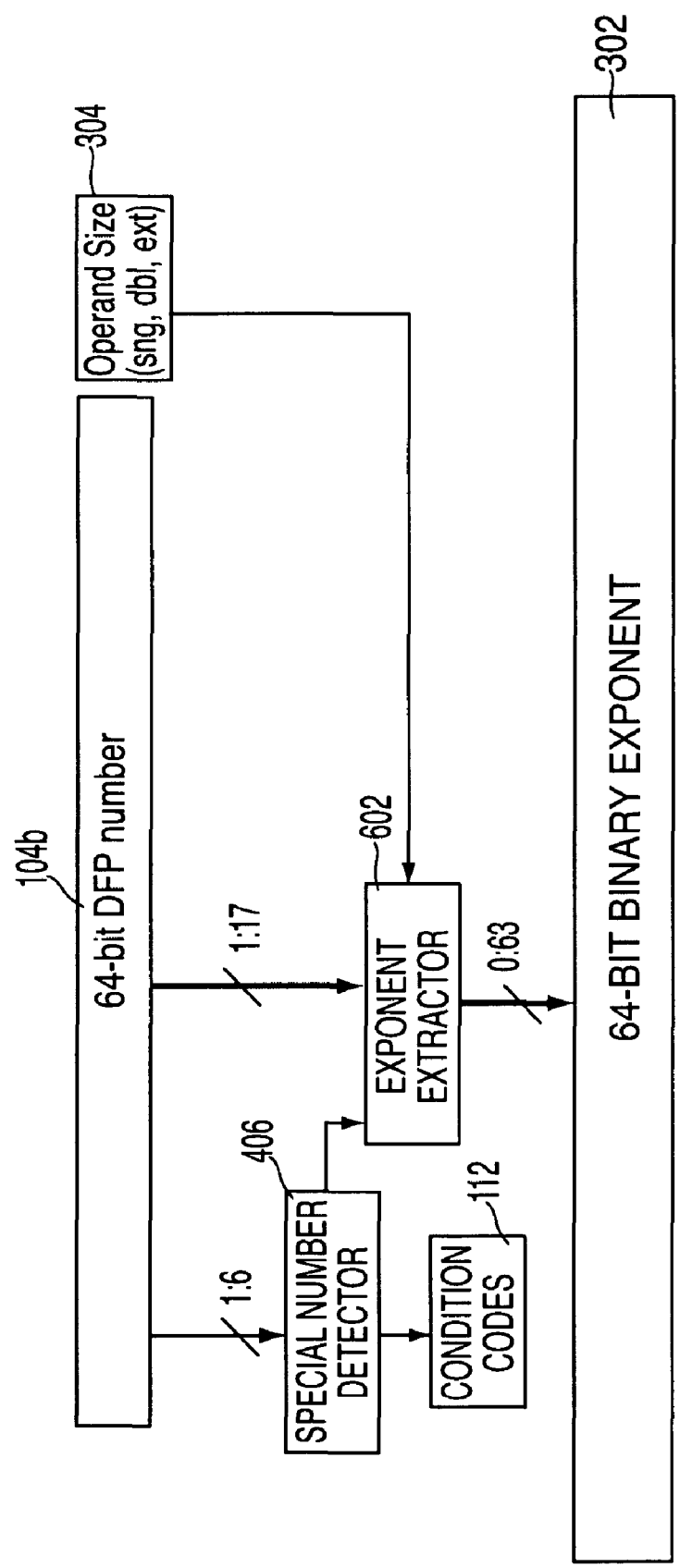
FIG. 6 an exemplary hardware diagram for implementing the extract exponent portion of converting from a DFP number to a SBCD number according to exemplary embodiments of the present invention.

FIG. 6 depicts an exemplary hardware diagram for implementing the exponent extraction for a conversion from a DFP number 104b into the binary exponent 302. FIG. 6 depicts a 64-bit DFP number, or upper half of a DFP number for extended precision, 104b and an operand size 304 as input. The special number detector 406 looks for the special numbers as described above based on the value of the combination field and first bit of the biased exponent continuation field. The special number detector 406 sets the condition codes 112 and outputs the status to an exponent extractor 602. The exponent extractor 602 determines the binary exponent 302 based on the combination field and the biased exponent continuation field the operand size 304 and output from the special number detector 406.

Exemplary embodiments of the present invention allow the processing described herein (coefficient compression, coefficient expansion, exponent insertion and exponent extraction) to be performed individually. For example, if the data set is known to contain identical exponent values (ie. for adding data values in a set known to be represented in pennies), then the extra processing and register usage required for extracting the exponent is not needed. Another example may be a routine used to convert a database from SBCD to DFP, no conversion process would be needed to convert DFP back to SBCD. Another example is to check for special values, only the extract exponent process is needed to obtain the necessary condition codes. The option to perform each conversion operation serially also allows the hardware required for the system to be reduced since the same intermediate registers may be used by all of the operations. This performance versus complexity tradeoff is important for hardware implementations where the area or power available for the required hardware may be limited.

Exemplary embodiments of the present invention provide four conversion operations that support the three IEEE 754R standard DFP formats. The operations include coefficient compression, coefficient expansion, exponent insertion and exponent extraction. Exemplary embodiments described herein may be utilized in a standard super-scalar microprocessor using minimal additional dataflow hardware. In addition, special numbers are detected and reported with the general case through result values and/or condition codes. Still further, invalid decimal data is reported through condition codes.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A system for converting from decimal floating point (DFP) into scaled binary coded decimal (SBCD), the system comprising:
   a mechanism for receiving a DFP number; and
   a mechanism including at least one computer hardware bank of densely packed decimal (DPD) to binary coded decimal (BCD) converters for performing coefficient expansion on the DFP number to create a BCD coefficient part of a SBCD number;
   a mechanism for performing exponent extraction on the DFP number to create a binary exponent part of the SBCD number; and a mechanism for setting a condition code, the condition code indicating the BCD coefficient is valid.

2. The system of claim 1 wherein coefficient expansion includes converting a coefficient of the DFP number from DPD to BCD using the at least one computer hardware bank of DPD to BCD converters, and a mechanism for extracting the most significant digit of the coefficient part of the SBCD number from the combination field of the DFP number.

3. The system of claim 2 wherein the at least one computer hardware bank of DPD to BCD converters is used two or more times to convert parts of the DFP coefficient.

4. The system of claim 1 further comprising a register corresponding to the exponent part of the SBCD number wherein the exponent extraction includes placing the bits corresponding to an exponent of the DFP number into the register where the two most significant bits are decoded from the combination field of the DFP number.

5. The system of claim 1 further comprising a mechanism for setting a condition code based on whether the DFP number is a special number.

6. The system of claim 1 wherein the resulting exponent part of the SBCD number indicates whether the DFP number is a special number.

7. The system of claim 1 wherein the DFP number is single precision.

8. The system of claim 1 wherein the DFP number is double precision.

9. The system of claim 1 wherein the DFP number is extended precision.

10. The system of claim 1 wherein the at least one mechanism includes both the mechanism for performing coefficient expansion and the mechanism for performing exponent extraction.

11. A computer implemented method for converting from decimal floating point (DFP) into scaled binary coded decimal (SBCD), the computer comprising a mechanism including at least one bank of densely packed decimal (DPD) to binary coded decimal (BCD) converters, and a mechanism for setting a condition code, the mechanism implementing a method, the method comprising:

receiving a DFP number;

performing coefficient expansion on the DFP number to create a coefficient part of a SBCD number and exponent extraction on the DFP number to create an exponent part of the SBCD number; and setting the condition code to indicate the validity of the coefficient part of the SBCD number.

12. The method of claim 11 wherein the coefficient expansion includes extracting the most significant digit of the coefficient part of the SBCD number from a combination field on the DFP number.

13. The method of claim 11 further comprising setting a condition code based on the validity of the DFP number.

14. A system for converting from decimal floating point (DFP) into scaled binary coded decimal (SBCD), the system comprising:

a mechanism including at least one bank of densely packed decimal (DPD) to binary coded decimal (BCD) converters for performing coefficient expansion;

the mechanism including circuitry for receiving a DFP number; and a mechanism for performing coefficient expansion on the DFP number to create a binary coded decimal (BCD) coefficient part of a SBCD number and a mechanism for performing exponent extraction on the DFP number to create an exponent part of the SBCD number, wherein:

the mechanism for performing coefficient expansion is implemented by double precision hardware;

the DFP number is single precision, double precision or extended precision;

the performing coefficient expansion includes determining the DFP number is a special number, and in response to determining that the BCD coefficient is valid setting a condition code; and the performing exponent extraction includes determining the DFP number is a special number and based on the DFP number being a special number setting the exponent part of the SBCD to indicate that the SBCD number is a special number.

* * * * *